(12) United States Patent
Li

(10) Patent No.: US 9,875,709 B2
(45) Date of Patent: Jan. 23, 2018

(54) GOA CIRCUIT FOR LTPS-TFT

(71) Applicant: Wuhan China Star Optoelectronics Technology Co., Ltd., Wuhan (CN)

(72) Inventor: Yafeng Li, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 134 days.

(21) Appl. No.: 14/917,572

(22) PCT Filed: Jan. 28, 2016

(86) PCT No.: PCT/CN2016/072427
§ 371 (c)(1),
(2) Date: Mar. 8, 2016

(87) PCT Pub. No.: WO2017/107286
PCT Pub. Date: Jun. 29, 2017

(65) Prior Publication Data
US 2017/0301303 A1    Oct. 19, 2017

(30) Foreign Application Priority Data
Dec. 22, 2015 (CN) .......................... 2015 1 0976804

(51) Int. Cl.
*G09G 3/34* (2006.01)
*G09G 3/36* (2006.01)
*H01L 27/12* (2006.01)
*H01L 29/786* (2006.01)

(52) U.S. Cl.
CPC ......... *G09G 3/3677* (2013.01); *H01L 27/124* (2013.01); *H01L 27/1222* (2013.01); *H01L 27/1255* (2013.01); *H01L 29/78672* (2013.01); *G09G 2300/0408* (2013.01);
(Continued)

(58) Field of Classification Search
CPC ......... G09G 2310/0286; G09G 3/3677; G09G 2300/0408; G09G 2310/0267; G09G 3/3674; G09G 2310/0289; G09G 2300/0871; G09G 2310/0264;
(Continued)

(56) References Cited

U.S. PATENT DOCUMENTS

| 7,949,086 B2 * | 5/2011 | Tsai ........................ G11C 19/28 377/64 |
| 2015/0279289 A1 * | 10/2015 | Yu ......................... G09G 3/3648 345/690 |
| 2016/0351156 A1 * | 12/2016 | Wu ........................ G11C 19/28 |

\* cited by examiner

*Primary Examiner* — Duc Dinh
(74) *Attorney, Agent, or Firm* — Leong C. Lei

(57) ABSTRACT

The invention provides a GOA circuit for LTPS-TFT, using a resistor (R1) and a tenth TFT (T10) to replace the second capacitor in known technology, and change the diode-style connection of the ninth TFT (T9) in known technology to connect one end of the resistor (R1) to the constant high voltage (VGH) and the other to the gate of the ninth TFT (T9) so that during the output end (G(n)) staying at low, the voltage of the second node (P(n)) follows the (M+1)-th clock signal (CK(M+1)) to switch between high and low, that is, following a fixed frequency to pull down the voltage of the second node (P(n)), prevents the second node from staying at high for long duration and prevents the sixth TFT (T6) and the seventh TFT (T7) from prolonged operation to cause threshold voltage shift and improve GOA circuit stability.

13 Claims, 6 Drawing Sheets

(52) U.S. Cl.
    CPC ............... *G09G 2310/0283* (2013.01); *G09G 2310/0289* (2013.01); *G09G 2310/0291* (2013.01); *G09G 2310/08* (2013.01)

(58) Field of Classification Search
    CPC ......... G09G 3/3655; G09G 2310/0243; G09G 3/3696; G09G 3/3266
    See application file for complete search history.

GOA CIRCUIT FOR LTPS-TFT

BACKGROUND OF THE INVENTION

1. Field of the Invention

The present invention relates to the field of display, and in particular to a gate driver on array (GOA) circuit for thin film transistor (TFT) based on low temperature poly-silicon (LTPS) semiconductor.

2. The Related Arts

As the liquid crystal display (LCD) shows the advantages of being thin, low power-consumption, and no radiation, the LCD is widely used in various devices, such as, liquid crystal TV, mobile phones, PDA, digital camera, PC monitors or notebook PC screens as well as the leading technology in tablet PCs.

The gate driver on array (GOA) technology is the array substrate column drive technology, by using the array substrate process for the LCD panel to manufacture the driver circuit for the horizontal scan line in the area around the active area on the substrate to replace the external integrated circuit (IC) to perform driving the horizontal scan lines. GOA technology can reduce the bonding process for the external IC and reduce cost, as well as the ability to realize narrow-border or borderless panels, and is used by many types of displays.

As the low temperature poly-silicon (LTPS) semiconductor TFT develops, the LTPS-TFT LCD gains much attention. The LTPS-TFT LCD has the advantages of high resolution, fast response, high luminance, and high opening ratio. Because the LTPS has a more orderly arrangement than the a-Si, the LTPS has ultra-high electron migration rate, 100 times higher than the a-Si. The LTPS can use GOA technology to manufacture the gate driver circuit on the TFT substrate to achieve system integration, save space and the cost for driver IC.

Refer to FIG. 1. The known GOA circuit for LTPS-TFT comprises: a plurality of cascade GOA units, for a positive integer n, the n-th stage GOA unit comprising: a first TFT T1, with a gate connected to an M-th clock signal CK(M), a source connected to an output end G(n−1) of an (n−1)-th stage GOA unit, and a drain connected to a third node K(n); a second TFT T2, with a gate connected to a first node Q(n), a source connected to an (M+1)-th clock signal CK(M+1), and a drain connected to an output end G(n); a third TFT T3, with a gate connected to an (M+2)-th clock signal CK(M+2), a drain connected to the third node K(n), and a source to an output end G(n+1) of an (n+1)-th stage GOA unit; a fourth TFT T4, with a gate connected to an (M+3)-th clock signal CK(M+3), a drain connected to the output end G(n), and a source connected to a constant low voltage VGL; a fifth TFT T5, with a gate connected to a constant high voltage VGH, a source connected to the third node K(n), and a drain connected to first node Q(n); a sixth TFT T6, with a gate connected to a second node P(n), a drain connected to the third node K(n), and a source connected to a constant low voltage VGL; a seventh TFT T7, with a gate connected to the second node P(n), a drain connected to the output end G(n), and a source connected to a constant low voltage VGL; an eighth TFT T8, with a gate connected to the third node K(n), a drain connected to the second node P(n), and a source connected to a constant low voltage VGL; a ninth TFT T9, with a gate and a source connected to the (M+1)-th clock signal CK(M+1), and a drain connected to the second node P(n); a first capacitor C1, with one end connected to the first node Q(n) and the other end connected to the output end G(n); and a second capacitor C2, with one end connected to the second node P(n) and the other end connected to the constant low voltage VGL.

The GOA circuit in FIG. 1 can scan forward or backward, and the forward scan process and the backward scan process are similar. Refer to FIG. 1 and FIG. 2. During forward scanning, scan process is as follows: first, both the M-th clock signal CK(M) and the output end G(n−1) of the (n−1)-th GOA unit provide a high voltage, the first TFT T1 and the fifth TFT T5 are turned on, and the first node Q(n) is pre-charged to high voltage; then, both the M-th clock signal CK(M) and the output end G(n−1) of the (n−1)-th GOA unit become low, the (M+1)-th clock signal CK(M+1) provides a high voltage, the first node Q(n) stays high due to the storage effect of the first capacitor C1, the second TFT T2 is turned on, the output end G(n) outputs the high voltage of the (M+1)-th clock signal CK(M) so that the first node Q(n) is raised to an even higher voltage, at the same time, the eighth TFT T8 is turned on, the second node P(n) is pulled down to the constant low voltage VGL, the sixth TFT T6 and the seventh TFT T7 are turned off; then, the (M+2)-th clock signal CK(M+2) and the output end G(n+1) of the (n+1)-th GOA unit provide high voltage, the first node Q(n) stays high, the (M+1)-th clock signal CK(M+1) becomes low, the output end G(n) outputs the low voltage of the (M+1)-th clock signal CK(M+1); and then, the M-th clock signal CK(M) provides high voltage again, the output end G(n−1) of the (n−1)-th GOA unit stays low, the first TFT T1 is turned on to pull down the first node Q(n) to low voltage, the eighth TFT T8 is turned off; then, the (M+1)-th clock signal CK(M+1) provides high voltage, the ninth TFT T9 is turned on, the second node P(n) is charged to high voltage, the sixth TFT T6 and the seventh TFT T7 are turned on to continue pulling down the first node Q(n) and output end G(n) to the constant low voltage VGL, respectively, the second node P(n) stays high under the storage effect of the second capacitor C2, the sixth TFT T6 and the seventh TFT T7 stay turned on during the duration of a frame to keep the first node Q(n) and the output end G(n) at low voltage.

In the above GOA circuit for LPTS-TFT, because the sixth TFT T6 and the seventh TFT T7 operate for a long duration, a threshold voltage shift (Vth shift) may occur to the sixth TFT T6 and the seventh TFT T7, which lowers the circuit stability and may lead to abnormal output for GOA circuit.

SUMMARY OF THE INVENTION

The object of the present invention is to provide a GOA circuit for LTPS-TFT, able to pull down the voltage of the second node at a fixed frequency to prevent the sixth TFT T6 and the seventh TFT T7 from prolonged operation and improve the GOA circuit stability.

To achieve the above object, the present invention provides a GOA circuit for LTPS-TFT, which comprises: a plurality of cascade GOA units, each GOA unit comprising: an output control module, an output module, a bootstrap capacitor and a pull-down module;

for a positive integer n, other than the GOA unit in the first and the last stages, in the n-th GOA unit, the output control module comprising: a first TFT, with a gate connected to an M-th clock signal, a source connected to an output end of a (n−1)-th GOA unit, and a drain connected to a third node; a third TFT, with a gate connected to an (M+2)-th clock signal, a drain connected to the third node, and a source connected to the output end of a (n+1)-th GOA unit; and a fifth TFT, with a gate connected to a constant high voltage, a source connected to the third node, and a drain connected to a first node;

the output module comprising: a second TFT, with a gate connected to the first node, a source connected to an (M+1)-th clock signal, and a drain connected to an output end;

the bootstrap capacitor having one end connected to the first node and the other end connected to the output end;

the pull-down module comprising: a fourth TFT, with a gate connected to an (M+3)-th clock signal, a drain connected to the output end, and a source connected to a constant low voltage; a sixth TFT, with a gate connected to a second node, a drain connected to the third node, and a source connected to the constant low voltage; a seventh TFT, with a gate connected to the second node, a drain connected to the output end, and a source connected to the constant low voltage; an eighth TFT, with a gate connected to the third node, a drain connected to the second node, and a source connected to the constant low voltage; a ninth TFT, with a gate connected to a fourth node, a source connected to the (M+1)-th clock signal, and a drain connected to the second node; a tenth TFT, with a gate connected to the third node, a drain connected to the fourth node, and a source connected to the constant low voltage; and a resistor, with one end connected to the constant high voltage and the other end connected to the fourth node.

During the output end staying at low, the voltage of the second node switches between high and low following the switching between high and low of the (M+1)-th clock signal.

In the first GOA unit, the first TFT has a source connected to a circuit start signal.

In the last GOA unit, the third TFT has a source connected to a circuit start signal.

The clock signals comprises four clock signals: the first clock signal, the second clock signal, the third clock signal and the fourth clock signal.

When the M-th clock signal is the third clock signal, the (M+2)-th clock signal and the (M+3)-th clock signal are the first clock signal and the second clock signal, respectively; when the M-th clock signal is the fourth clock signal, the (M+1)-th clock signal, the (M+2)-th clock signal and the (M+3)-th clock signal are the first clock signal, the second clock signal and the third clock signal, respectively.

During forward scanning, the first clock signal and the circuit start signal are provided first to the first TFT in the first GOA unit; during backward scanning, the first clock signal and the circuit start signal are provided first to the third TFT in the last GOA unit.

The present invention also provides a GOA circuit for LTPS-TFT, which comprises: a plurality of cascade GOA units, each GOA unit comprising: an output control module, an output module, a bootstrap capacitor and a pull-down module;

for a positive integer n, other than the GOA unit in the first and the last stages, in the n-th GOA unit, the output control module comprising: a first TFT, with a gate connected to an M-th clock signal, a source connected to an output end of a (n−1)-th GOA unit, and a drain connected to a third node; a third TFT, with a gate connected to an (M+2)-th clock signal, a drain connected to the third node, and a source connected to the output end of a (n+1)-th GOA unit; and a fifth TFT, with a gate connected to a constant high voltage, a source connected to the third node, and a drain connected to a first node;

the output module comprising: a second TFT, with a gate connected to the first node, a source connected to an (M+1)-th clock signal, and a drain connected to an output end;

the bootstrap capacitor having one end connected to the first node and the other end connected to the output end;

the pull-down module comprising: a fourth TFT, with a gate connected to an (M+3)-th clock signal, a drain connected to the output end, and a source connected to a constant low voltage; a sixth TFT, with a gate connected to a second node, a drain connected to the third node, and a source connected to the constant low voltage; a seventh TFT, with a gate connected to the second node, a drain connected to the output end, and a source connected to the constant low voltage; an eighth TFT, with a gate connected to the third node, a drain connected to the second node, and a source connected to the constant low voltage; a ninth TFT, with a gate connected to a fourth node, a source connected to the (M+1)-th clock signal, and a drain connected to the second node; a tenth TFT, with a gate connected to the third node, a drain connected to the fourth node, and a source connected to the constant low voltage; and a resistor, with one end connected to the constant high voltage and the other end connected to the fourth node;

wherein in the first GOA unit, the first TFT has a source connected to a circuit start signal;

wherein the clock signals comprises four clock signals: the first clock signal, the second clock signal, the third clock signal and the fourth clock signal;

wherein the TFTs are of the N-type LTPS-TFT.

Compared to the known techniques, the present invention provides the following advantages: the present invention provides a GOA circuit for LTPS-TFT, using a resistor and a tenth TFT to replace the second capacitor in known technology, and change the diode-style connection of the ninth TFT in known technology to connect one end of the resistor to the constant high voltage and the other to the gate of the ninth TFT so that during the output end staying at low, the voltage of the second node follows the (M+1)-th clock signal to switch between high and low, that is, following a fixed frequency to pull down the voltage of the second node, prevents the second node from staying at high for long duration and prevents the sixth TFT and the seventh TFT from prolonged operation to cause threshold voltage shift and improve GOA circuit stability.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
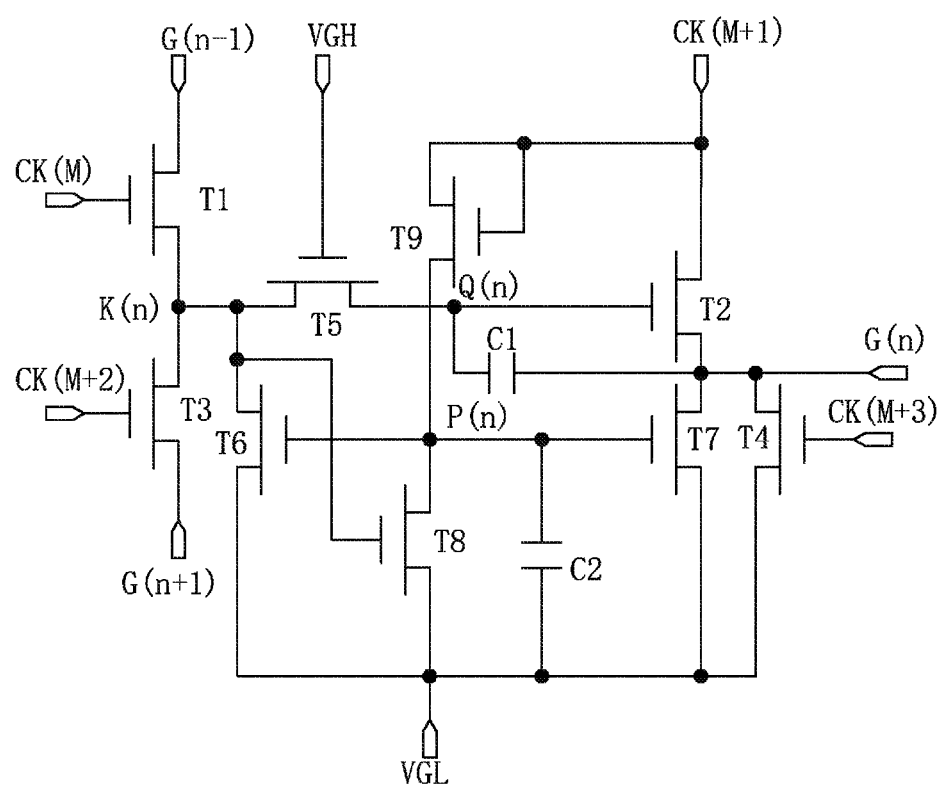
FIG. 1 is a schematic view showing a GOA circuit for known LTPS-TFT.
Figure 2:
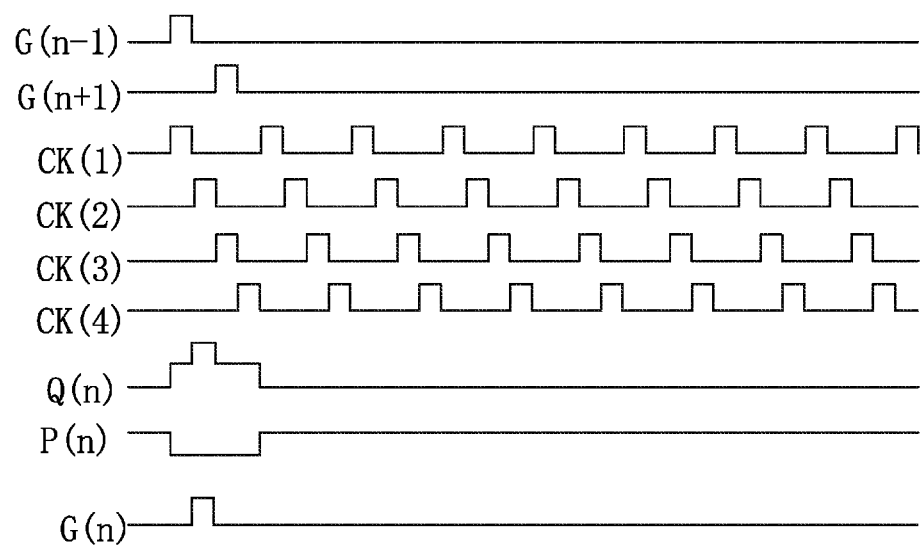
FIG. 2 is a schematic view showing the forward scanning timing for GOA circuit in FIG. 1.
Figure 3:
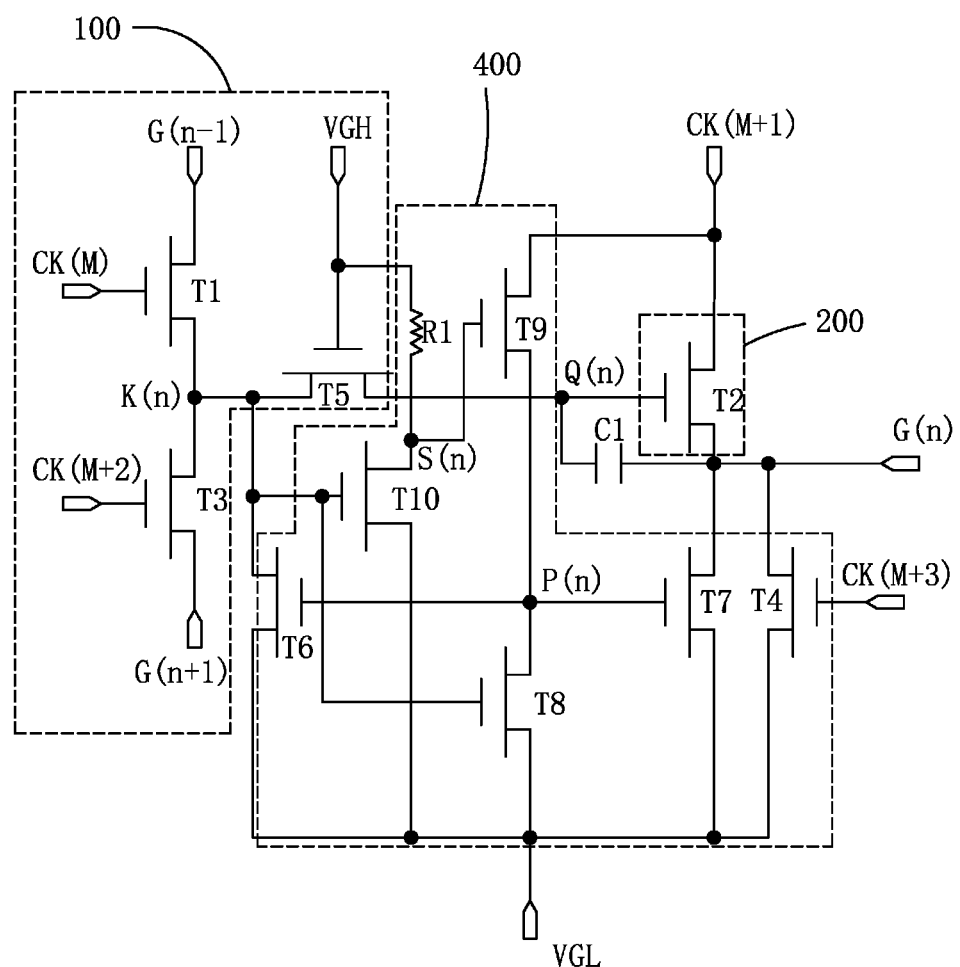
FIG. 3 is a schematic view showing the GOA circuit for LTPS-TFT provided by an embodiment of the present invention.
Figure 4:
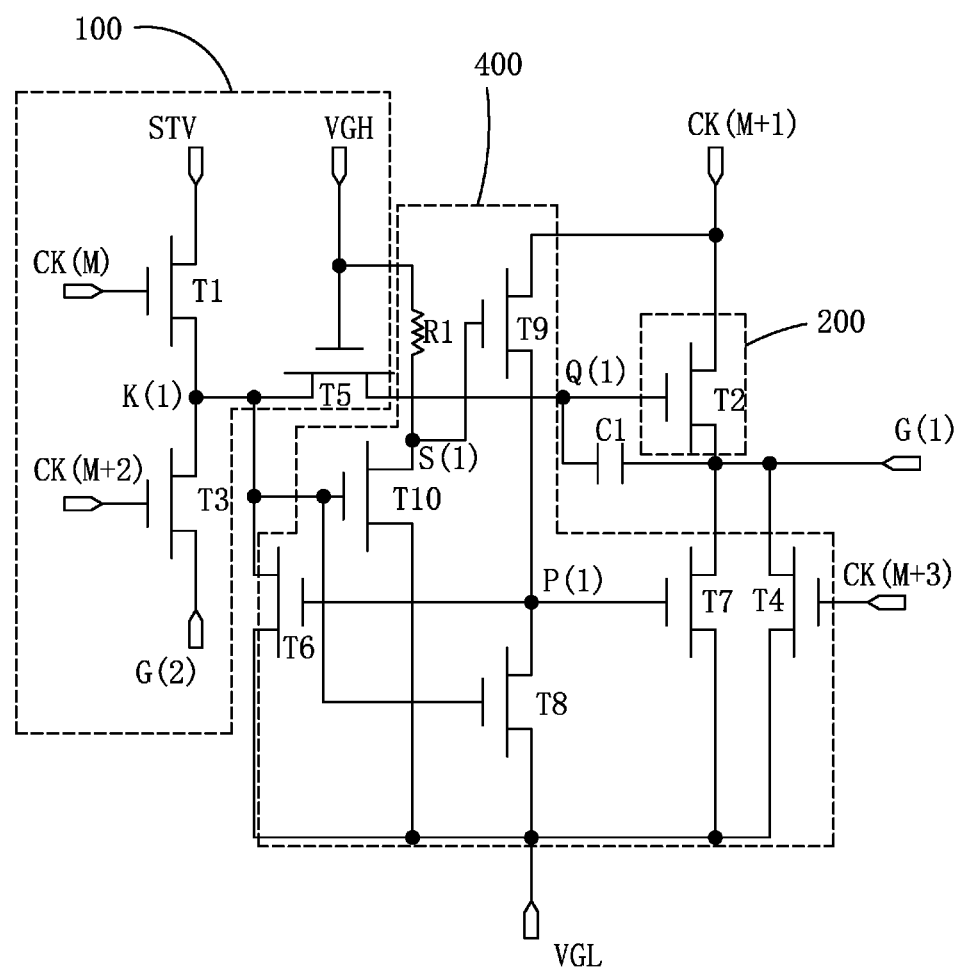
FIG. 4 is a schematic view showing the first GOA unit of the GOA circuit for LTPS-TFT provided by an embodiment of the present invention.
Figure 5:
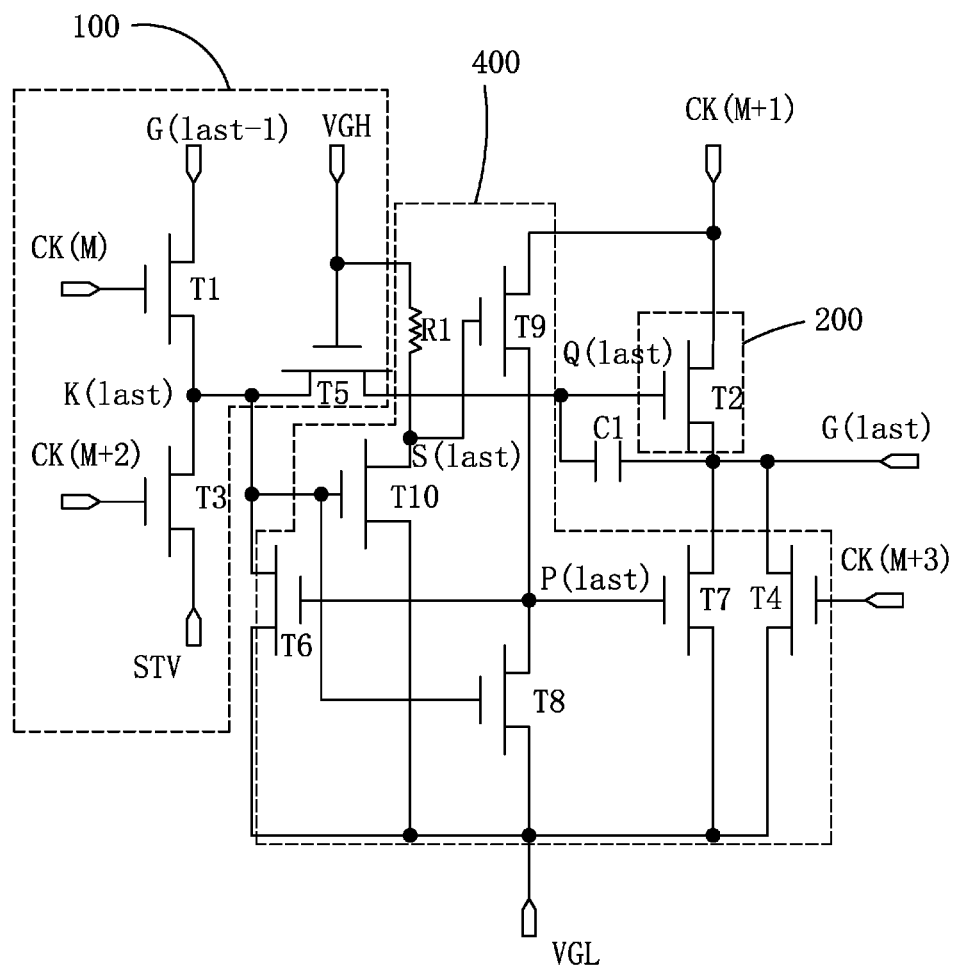
FIG. 5 is a schematic view showing the last GOA unit of the GOA circuit for LTPS-TFT provided by an embodiment of the present invention.

Refer to FIG. 3. the present invention provides a GOA circuit for LTPS-TFT, which comprises: a plurality of cascade GOA units, each GOA unit comprising: an output control module 100, an output module 200, a bootstrap capacitor C1 and a pull-down module 400.

For a positive integer n, other than the GOA unit in the first and the last stages, in the n-th GOA unit:

The output control module 100 comprises: a first TFT T1, with a gate connected to an M-th clock signal CK(M), a source connected to an output end (Gn−1) of a (n−1)-th GOA unit, and a drain connected to a third node K(n); a third TFT T3, with a gate connected to an (M+2)-th clock signal CK(M+2), a drain connected to the third node K(n), and a source connected to the output end of a (n+1)-th GOA unit G(n+1); and a fifth TFT T5, with a gate connected to a constant high voltage VGH, a source connected to the third node K(n), and a drain connected to a first node Q(n).

The output module 200 comprises: a second TFT T2, with a gate connected to the first node Q(n), a source connected to an (M+1)-th clock signal CK(M+1), and a drain connected to an output end G(n).

The bootstrap capacitor C1 has one end connected to the first node Q(n) and the other end connected to the output end G(n).

The pull-down module 400 comprises: a fourth TFT T4, with a gate connected to an (M+3)-th clock signal CK(M+3), a drain connected to the output end G(n), and a source connected to a constant low voltage VGL; a sixth TFT T6, with a gate connected to a second node P(n), a drain connected to the third node K(n), and a source connected to the constant low voltage VGL; a seventh TFT T7, with a gate connected to the second node P(n), a drain connected to the output end G(n), and a source connected to the constant low voltage VGL; an eighth TFT T8, with a gate connected to the third node K(n), a drain connected to the second node P(n), and a source connected to the constant low voltage VGL; a ninth TFT T9, with a gate connected to a fourth node S(n), a source connected to the (M+1)-th clock signal CK(M+1), and a drain connected to the second node P(n); a tenth TFT T10, with a gate connected to the third node K(n), a drain connected to the fourth node S(n), and a source connected to the constant low voltage VGL; and a resistor R1, with one end connected to the constant high voltage VGH and the other end connected to the fourth node S(n).

Specifically, in the first GOA unit, the first TFT T1 has the source connected to a circuit start signal STV; in the last GOA unit, the third TFT T3 has the source connected to the circuit start signal STV.

Specifically, all the TFTs are of the N-type LTPS-TFT.

Figure 6:
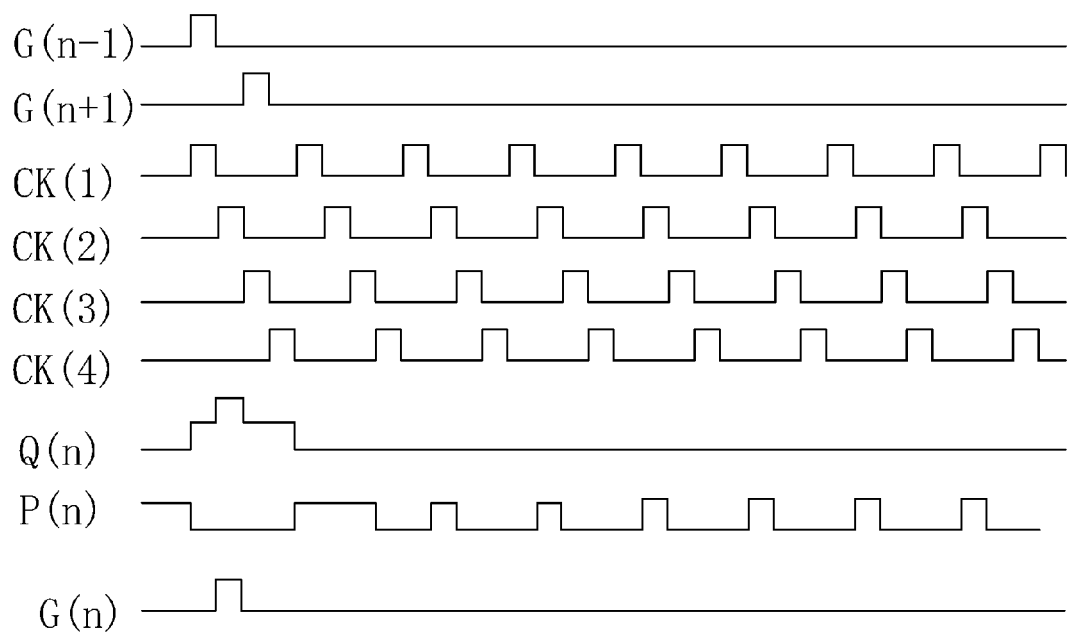
FIG. 6 is a schematic view showing the forward scanning timing for the GOA circuit for LTPS-TFT provided by an embodiment of the present invention.

Refer to FIG. 3 and FIG. 6, the clock signals comprises four clock signals: the first clock signal CK(1), the second clock signal CK(2), the third clock signal CK(3) and the fourth clock signal CK(4). When the M-th clock signal is the third clock signal CK(3), the (M+2)-th clock signal and the (M+3)-th clock signal are the first clock signal CK(1) and the second clock signal CK(2), respectively; when the M-th clock signal is the fourth clock signal CK(4), the (M+1)-th clock signal, the (M+2)-th clock signal and the (M+3)-th clock signal are the first clock signal CK(1), the second clock signal CK(2) and the third clock signal CK(3), respectively.

The GOA circuit for LTPS-TFT of the present invention can scan forward from the first stage to the last stage, or backward from the last stage to the first stage, wherein during forward scanning, the first clock signal CK(1) and the circuit start signal STV are provided first to the first TFT T1 in the first GOA unit; during backward scanning, the first clock signal CK(1) and the circuit start signal SW are provided first to the third TFT T3 in the last GOA unit.

It should be noted that the GOA circuit for LTPS-TFT can pull down the second node P(n) to a low voltage at a fixed frequency regardless scanning forward or backward. Take forward scanning as example, the specific process is as follows:

Phase 1: the M-th clock signal and the output end G(n−1) of the (n−1)-th GOA unit are both high, the (M+1)-th, (M+2)-th, and (M+3)-th clock signals CK(M+1), CK(M+2), CK(M+3) provide low voltage; the output end G(n+1) of the (n+1)-th GOA unit also provides low voltage, the first TFT T1 is turned on by the control of M-th clock signal CK(M), the fifth TFT T5 is always turned on due to the control of the constant high voltage VGH, the third node K(n) and the first node Q(n) always have the same voltage, the first node Q(n) is pre-charged to high voltage, the eighth TFT T8 and the tenth TFT T10, both controlled by the first node Q(n), are turned on, the second and the fourth nodes P(n), S(n) are pulled down to the constant low voltage VGL, the sixth TFT T6 and the seventh TFT T7, controlled by the second node P(n), are turned off, and the ninth TFT T9, controlled by the fourth node S(n), is turned off.

Phase 2: the M-th clock signal and the output end G(n−1) of the (n−1)-th GOA unit become low, the (M+1)-th clock signal CK(M+1) provides high voltage while the (M+2)-th and (M+3)-th clock signals CK(M+2), CK(M+3) and the output end G(n+1) of the (n+1)-th GOA unit still provide low voltage; the first node Q(n) stays the same due to the storage effect of the bootstrap capacitor C1, the second TFT T2 is turned on, the output end G(n) outputs the high voltage of the (M+1)-th clock signal CK(M+1), and raises the first node Q(n) to an even higher voltage, the eighth TFT T8 and the tenth TFT T10 are still turned on, the second and the fourth nodes P(n), S(n) stay at the constant low voltage VGL, the sixth TFT T6 and the seventh TFT T7, controlled by the second node P(n), are still turned off, and the ninth TFT T9, controlled by the fourth node S(n), is still turned off.

Phase 3: the (M+1)-th clock signal CK(M+1) becomes low, the (M+2)-th clock signal CK(M+2) and the output end G(n+1) of the (n+1)-th GOA unit provide high voltage; the M-th clock signal CK(M), (M+3)-th clock signal CK(M+3) and the output end G(n−1) of the (n−1)-th GOA unit still provide low voltage, the third TFT T3, controlled by the (M+2)-th clock signal CK(M+2), is turned on, the first node Q(n) stays high, the second TFT T2, the eighth TFT T8 and the tenth TFT T10, controlled by the first node Q(n), are still turned on, the second and the fourth nodes P(n), S(n) stay at the constant low voltage VGL, the sixth TFT T6 and the seventh TFT T7, controlled by the second node P(n), are still turned off, and the ninth TFT T9, controlled by the fourth node S(n), is still turned off, the output end G(n) outputs the low voltage of the (M+1)-th clock signal CK(M+1).

Phase 4: the M-th clock signal CK(M) provides high voltage again, the (M+2)-th clock signal CK(M+2) becomes low, the (M+1)-th and (M+3)-th clock signals CK(M+1), CK(M+3) and the output end G(n−1) of the (n−1)-th GOA unit still provide low voltage, the first TFT T1, controlled by the M-th clock signal CK(M), is turned on to pull down the first node Q(n) to low voltage, the second TFT T2, the eighth TFT T8 and the tenth TFT T10, controlled by the first node Q(n), are turned off.

Phase 5: because of the division of the resistor R1, the fourth node S(n) always stays high, the ninth TFT T9 is always turned on; as the (M+1)-th clock signal CK(M+1) switches alternatingly between high and low, the second node P(n) will be charged to high voltage when the (M+1)-th clock signal CK(M+1) is high, and the second node P(n) will be pulled down to low voltage when the (M+1)-th clock signal CK(M+1) is low; the sixth TFT T6 and the seventh TFT T7 are turned off, the first node Q(n) and the output end G(n) stay at low voltage, that is, during the output end G(n) staying at low, the voltage of the second node P(n) switches alternatingly between high and low following the switching between high and low of the(M+1)-th clock signal CK(M+1).

Compared to the known technology wherein the second node P(n) stays at high voltage, and the sixth TFT T6 and the seventh TFT T7 stay turned on for the entire duration of a frame, the second node P(n) during phase 5 of the present invention is pulled down at a fixed frequency to avoid staying at high for long duration and prevents the sixth TFT T6 and the seventh TFT T7 from prolonged operation to cause threshold voltage shift and improve GOA circuit stability.

In summary, the present invention provides a GOA circuit for LTPS-TFT, using a resistor and a tenth TFT to replace the second capacitor in known technology, and change the diode-style connection of the ninth TFT in known technology to connect one end of the resistor to the constant high voltage and the other to the gate of the ninth TFT so that during the output end staying at low, the voltage of the second node follows the (M+1)-th clock signal to switch between high and low, that is, following a fixed frequency to pull down the voltage of the second node, prevents the second node from staying at high for long duration and prevents the sixth TFT and the seventh TFT from prolonged operation to cause threshold voltage shift and improve GOA circuit stability.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A gate driver on array (GOA) circuit for low temperature poly-silicon (LTPS) thin film transistor (TFT), which comprises: a plurality of cascade GOA units, each GOA unit comprising: an output control module, an output module, a bootstrap capacitor and a pull-down module;

for a positive integer n, other than the GOA unit in the first and the last stages, in the n-th GOA unit:

the output control module comprising: a first TFT, with a gate connected to an M-th clock signal, a source connected to an output end of a (n−1)-th GOA unit, and a drain connected to a third node; a third TFT, with a gate connected to an (M+2)-th clock signal, a drain connected to the third node, and a source connected to the output end of a (n+1)-th GOA unit; and a fifth TFT, with a gate connected to a constant high voltage, a source connected to the third node, and a drain connected to a first node;

the output module comprising: a second TFT, with a gate connected to the first node, a source connected to an (M+1)-th clock signal, and a drain connected to an output end;

the bootstrap capacitor having one end connected to the first node and the other end connected to the output end;

the pull-down module comprising: a fourth TFT, with a gate connected to an (M+3)-th clock signal, a drain connected to the output end, and a source connected to a constant low voltage; a sixth TFT, with a gate connected to a second node, a drain connected to the third node, and a source connected to the constant low voltage; a seventh TFT, with a gate connected to the second node, a drain connected to the output end, and a source connected to the constant low voltage; an eighth TFT, with a gate connected to the third node, a drain connected to the second node, and a source connected to the constant low voltage; a ninth TFT, with a gate connected to a fourth node, a source connected to the (M+1)-th clock signal, a and drain connected to the second node; a tenth TFT, with a gate connected to the third node, a drain connected to the fourth node, and a source connected to the constant low voltage; and a resistor, with one end connected to the constant high voltage and the other end connected to the fourth node.

2. The GOA circuit for LTPS-TFT as claimed in claim 1, wherein during the output end staying at low, the voltage of the second node switches between high and low following the switching between high and low of the(M+1)-th clock signal.

3. The GOA circuit for LTPS-TFT as claimed in claim 1, wherein in the first GOA unit, the first TFT has a source connected to a circuit start signal.

4. The GOA circuit for LTPS-TFT as claimed in claim 3, wherein in the last GOA unit, the third TFT has a source connected to a circuit start signal.

5. The GOA circuit for LTPS-TFT as claimed in claim 1, wherein the clock signals comprises four clock signals: the first clock signal, the second clock signal, the third clock signal and the fourth clock signal.

6. The GOA circuit for LTPS-TFT as claimed in claim 5, wherein when the M-th clock signal is the third clock signal, the (M+2)-th clock signal and the (M+3)-th clock signal are the first clock signal and the second clock signal, respectively; when the M-th clock signal is the fourth clock signal, the (M+1)-th clock signal, the (M+2)-th clock signal and the (M+3)-th clock signal are the first clock signal, the second clock signal and the third clock signal, respectively.

7. The GOA circuit for LTPS-TFT as claimed in claim 4, wherein during forward scanning, the first clock signal and the circuit start signal are provided first to the first TFT in the first GOA unit; during backward scanning, the first clock signal and the circuit start signal are provided first to the third TFT in the last GOA unit.

8. The GOA circuit for LTPS-TFT as claimed in claim 1, wherein the TFTs are all of the N-type LTPS-TFTs.

9. A gate driver on array (GOA) circuit for low temperature poly-silicon (LTPS) thin film transistor (TFT), which comprises: a plurality of cascade GOA units, each GOA unit comprising: an output control module, an output module, a bootstrap capacitor and a pull-down module;

for a positive integer n, other than the GOA unit in the first and the last stages, in the n-th GOA unit:

the output control module comprising: a first TFT, with a gate connected to an M-th clock signal, a source connected to an output end of a (n−1)-th GOA unit, and a drain connected to a third node; a third TFT, with a gate connected to an (M+2)-th clock signal, a drain connected to the third node, and a source connected to the output end of a (n+1)-th GOA unit; and a fifth TFT, with a gate connected to a constant high voltage, a source connected to the third node, and a drain connected to a first node;

the output module comprising: a second TFT, with a gate connected to the first node, a source connected to an (M+1)-th clock signal, and a drain connected to an output end;

the bootstrap capacitor having one end connected to the first node and the other end connected to the output end;

the pull-down module comprising: a fourth TFT, with a gate connected to an (M+3)-th clock signal, a drain connected to the output end, and a source connected to a constant low voltage; a sixth TFT, with a gate connected to a second node, a drain connected to the third node, and a source connected to the constant low voltage; a seventh TFT, with a gate connected to the second node, a drain connected to the output end, and a source connected to the constant low voltage; an eighth TFT, with a gate connected to the third node, a drain connected to the second node, and a source connected to the constant low voltage; a ninth TFT, with a gate connected to a fourth node, a source connected to the (M+1)-th clock signal, and a drain connected to the second node; a tenth TFT, with a gate connected to the third node, a drain connected to the fourth node, and a source connected to the constant low voltage; and a resistor, with one end connected to the constant high voltage and the other end connected to the fourth node;

wherein in the first GOA unit, the first TFT has a source connected to a circuit start signal;

wherein the clock signals comprises four clock signals: the first clock signal, the second clock signal, the third clock signal and the fourth clock signal;

wherein the TFTs are all of the N-type LTPS-TFTs.

10. The GOA circuit for LTPS-TFT as claimed in claim 9, wherein during the output end staying at low, the voltage of the second node switches between high and low following the switching between high and low of the (M+1)-th clock signal.

11. The GOA circuit for LTPS-TFT as claimed in claim 9, wherein in the last GOA unit, the third TFT has a source connected to a circuit start signal.

12. The GOA circuit for LTPS-TFT as claimed in claim 9, wherein when the M-th clock signal is the third clock signal, the (M+2)-th clock signal and the (M+3)-th clock signal are the first clock signal and the second clock signal, respectively; when the M-th clock signal is the fourth clock signal, the (M+1)-th clock signal, the (M+2)-th clock signal and the (M+3)-th clock signal are the first clock signal, the second clock signal and the third clock signal, respectively.

13. The GOA circuit for LTPS-TFT as claimed in claim 11, wherein during forward scanning, the first clock signal and the circuit start signal are provided first to the first TFT in the first GOA unit; during backward scanning, the first clock signal and the circuit start signal are provided first to the third TFT in the last GOA unit.

* * * * *